US009761230B2

(12) United States Patent
Daniel et al.

(10) Patent No.: US 9,761,230 B2
(45) Date of Patent: Sep. 12, 2017

(54) FRAME LOSS CORRECTION BY WEIGHTED NOISE INJECTION

(71) Applicant: ORANGE, Paris (FR)

(72) Inventors: Jerome Daniel, Penvenan (FR); Julien Faure, Ploubezre (FR)

(73) Assignee: Orange, Paris (FR)

( * ) Notice: Subject to any disclaimer, the term of this patent is extended or adjusted under 35 U.S.C. 154(b) by 34 days.

(21) Appl. No.: 14/784,641

(22) PCT Filed: Apr. 17, 2014

(86) PCT No.: PCT/FR2014/050945
§ 371 (c)(1),
(2) Date: Oct. 15, 2015

(87) PCT Pub. No.: WO2014/170617
PCT Pub. Date: Oct. 23, 2014

(65) Prior Publication Data

US 2016/0055852 A1 Feb. 25, 2016

(30) Foreign Application Priority Data

Apr. 18, 2013 (FR) ..................................... 13 53551

(51) Int. Cl.
*G10L 21/00* (2013.01)
*G10L 19/005* (2013.01)
(Continued)

(52) U.S. Cl.
CPC ............ *G10L 19/005* (2013.01); *G10L 19/12* (2013.01); *G10L 21/0208* (2013.01)

(58) Field of Classification Search
USPC ....... 704/219, 500, 211, 225, 264, 201, 205, 704/206; 370/412; 714/752; 700/94
See application file for complete search history.

(56) References Cited

U.S. PATENT DOCUMENTS 6,952,668 B1 10/2005 Kapilow
7,831,421 B2 * 11/2010 Khalil .................. G10L 21/045 704/206
(Continued)

OTHER PUBLICATIONS

Kim et al., "VoIP Receiver-Based Adaptive Playout Scheduling and Packet Loss Concealment Technique," IEEE Transactions on Consumer Electronics, IEEE Service Center, New York, NY, US, vol. 59, No. 1, Feb. 2013, pp. 250-258.
(Continued)

*Primary Examiner* — Neeraj Sharma
(74) *Attorney, Agent, or Firm* — Drinker Biddle & Reath LLP

(57) ABSTRACT

A method for processing a digital signal, implemented during decoding of the signal, in order to replace a succession of samples lost during decoding, the method comprising steps of: generating a structure of a signal for replacing the lost succession, this structure comprising spectral components determined from valid samples received during decoding before the succession of lost samples; generating a residue between a digital signal available to the decoder, comprising received valid samples, and a signal generated from the spectral components; and extracting blocks from the residue, method in which window weighted blocks are injected into the structure using an overlap-add approach, the injected blocks partially overlapping in time.

11 Claims, 11 Drawing Sheets

(51) Int. Cl.

| | |
|---|---|
| ***G10L 21/0208*** | (2013.01) |
| ***G10L 19/12*** | (2013.01) |
| *H03M 13/00* | (2006.01) |
| *H04L 12/28* | (2006.01) |
| *G06F 17/00* | (2006.01) |

(56) References Cited

U.S. PATENT DOCUMENTS

| | | | | |
|---|---|---|---|---|
| 8,068,926 | B2 * | 11/2011 | Andersen | G10L 19/005 700/94 |
| 8,600,738 | B2 * | 12/2013 | Zhan | G10L 19/005 704/207 |
| 9,177,570 | B2 * | 11/2015 | Fex | G10L 19/167 |
| 2003/0135374 | A1 * | 7/2003 | Hardwick | G10L 13/02 704/264 |
| 2004/0010407 | A1 * | 1/2004 | Kovesi | G10L 19/005 704/219 |
| 2005/0015242 | A1 * | 1/2005 | Gracie | G01N 22/02 704/211 |
| 2005/0058145 | A1 * | 3/2005 | Florencio | G10L 19/005 370/412 |
| 2008/0033718 | A1 * | 2/2008 | Zopf | G10L 19/005 704/229 |
| 2008/0046233 | A1 * | 2/2008 | Chen | G10L 19/005 704/211 |
| 2008/0249767 | A1 * | 10/2008 | Ertan | G10L 19/005 704/219 |
| 2008/0294428 | A1 | 11/2008 | Raifel et al. | |
| 2009/0037168 | A1 * | 2/2009 | gao | G10L 19/005 704/219 |
| 2009/0171656 | A1 * | 7/2009 | Kapilow | G10L 19/005 704/207 |
| 2010/0121635 | A1 * | 5/2010 | Erell | G10L 21/02 704/225 |
| 2011/0022924 | A1 * | 1/2011 | Malenovsky | G10L 19/005 714/752 |
| 2011/0125505 | A1 * | 5/2011 | Vaillancourt | G10L 19/005 704/500 |
| 2011/0191111 | A1 * | 8/2011 | Chu | G10L 19/005 704/500 |
| 2012/0101814 | A1 * | 4/2012 | Elias | G10L 19/005 704/207 |

OTHER PUBLICATIONS

Lindblom et al., "Packet Loss Concealment Based on Sinusoidal Extrapolation," 2002 IEEE International Conference on Acoustics, Speech, and Signal Processing, Proceedings (ICASSP), IEEE, New York, NY, US, vol. 1, May 13, 2002, pp. 1-173 -1-176.

Mahfuz, "Packet Loss Concealment for Voice Transmission over IP Networks," Thesis Submitted to the Faculty of Graduate Studies and Research in Partial Fulfillment of the Requirements for the Degree of Engineering at the McGill University of Montreal, Sep. 27, 2001, pp. 1-107.

Serizawa et al., "A Packet Loss Concealment Method Using Pitch Waveform Repetition and Internal State Update on the Decoded Speech for the Sub-Band ADPCM Wideband Speech Codec," Speech Coding, 2002, IEEE Workshop Proceedings, IEEE, Piscataway, NJ, USA, Oct. 6, 2002, pp. 68-70.

International Telecommunication Union, "General Aspects of Digital Transmission Systems, Terminal Equipments, Pulse Code Modulation (PCM) of Voice Frequencies," ITU-T Telecommunication Standardization Sector of ITU, ITU-T Recommendation G.711 (Extract from the Blue Book), 1993, 12 pages.

International Telecommunication Union, "Series G: Transmission Systems and Media, Digital Systems and Networks, Digital terminal equipments—Coding of analogue signals by methods other than PCM, Wideband coding of speech at around 16 kbits using Adaptive Multi-Rate Wideband (AMR-WB)," ITU-T Telecommunication Standardization Sector of ITU, ITU-T Recommendation G.722.2, Jul. 2003, 71 pages.

International Telecommunication Union, "Series G: Transmission Systems and Media, Digital Systems and Networks, Digital terminal equipments—Coding of analogue signals by methods other than PCM, Low-complexity coding at 24 and 32 kbits for hands-free operation in systems with low frame loss," ITU-T Telecommunication Standardization Sector of ITU, ITU-T Recommendation G.722.1, May 2005, 34 pages.

Nternational Telecommunication Union, "Series G: Transmission Systems and Media, Digital Systems and Networks, Digital terminal equipments—Coding of analogue signals, Low-complexity, full-band audio coding for high-quality, conversational applications," ITU-T Telecommunication Standardization Sector of ITU, ITU-T Recommendation G.719, Jun. 2008, 57 pages.

* cited by examiner

FRAME LOSS CORRECTION BY WEIGHTED NOISE INJECTION

CROSS-REFERENCE TO RELATED APPLICATIONS

This application is the U.S. national phase of the International Patent Application No. PCT/FR2014/050945 filed Apr. 17, 2014, which claims the benefit of French Application No. 13 53551 filed Apr. 18, 2013, the entire content of which is incorporated herein by reference.

BACKGROUND

The present invention relates to signal correction, particularly in a decoder when there is frame loss in the signal received by the decoder.

The signal is in the form of a succession of samples, divided into successive frames where the term frame means a signal segment composed of at least one sample (having a frame contain a single sample then simply corresponds to a signal in the form of a succession of samples).

The invention lies in the field of digital signal processing, particularly but not exclusively in the field of encoding/decoding an audio signal. Frame loss occurs when a communication (either transmitted in real time or stored for later transmission) using a coder and decoder is disrupted by channel conditions (due to radio issues, network congestion, etc.).

In this case, the decoder uses packet loss correction mechanisms (or "masking") in an attempt to substitute a reconstructed signal for the missing signal, using information available in the decoder (such as the already decoded signal or the parameters received in previous frames). This technique allows maintaining a good quality of service despite degraded channel performance.

Frame loss correction techniques are often highly dependent on the type of coding used.

In the case of coding a speech signal based on CELP technology (for "Code Excited Linear Prediction"), the frame loss correction applies the CELP model. For example, when coding according to Recommendation G722.2, the solution for replacing a lost frame (or "packet") is to prolong the use of a long-term prediction (LTP) gain by attenuating it, as well as to prolong the use of each ISF parameter (for "Imittance Spectral Frequency") by bringing them towards their respective averages. The pitch period of the speech signal (designated "LTP-Lag") is also repeated. In addition, the decoder is supplied random values for parameters characterizing the "innovation" (excitation in CELP coding).

It should be noted that applying this type of method for transform coding or for PCM ("Pulse Code Modulation") coding requires CELP coding in the decoder, which introduces additional complexity.

In ITU-T Recommendation G.711 for a waveform coder, the processing for frame loss correction (exemplified in Appendix I of that recommendation) finds a pitch period in the speech signal already decoded and repeats the last pitch period with overlap-add between the already decoded signal and the repeated signal. This treatment "erases" audio artifacts but requires additional time in the decoder (time corresponding to the duration of the overlap).

The technique most often used to correct frame loss in transform coding consists of repeating the spectrum decoded in the last frame received. For example, in the case of coding according to Recommendation G.722.1, the MLT ("modulated lapped transform"), equivalent to a modified discrete cosine transform (MDCT) with 50% overlap and sinusoidal windows, ensures a transition (between the last frame lost and the repeated frame) which is sufficiently slow to erase artifacts due to simple repetition of the frame.

Advantageously, this technology does not require any additional time because it exploits the temporal aliasing of the MLT transform to create an overlap-add with the reconstructed signal. This is a very inexpensive technique in terms of resources.

However, it has a flaw related to the temporal inconsistency between the signal just before the frame loss and the repeated signal. This results in an audible phase discontinuity that can produce significant audio artifacts if the overlap between the two frames is small (as is the case when "low-delay" MDCT windows are used). This situation with a short overlap is illustrated in FIG. 1B for the case of a low-delay MLT transform, for comparison with the usual situation of FIG. 1A where long sine windows are used according to Recommendation G.722.1 (then offering a long overlap period ZRA, with very gradual modulation). It appears that modulation by a low-delay window produces an audible phase shift due to the short overlap area ZRB, as represented in FIG. 1B.

In this case, even when a solution is implemented that combines pitch detection (the case when coding according to Recommendation G.711—Appendix I) and an overlap-add produced by the window of an MDCT transform, this would not be sufficient to eliminate audio artifacts related to the phase shift.

Another frame loss correction technique is to generate a synthesis signal from a signal structure extracted from a pitch period. Pitch period is understood to mean a fundamental period, particularly in the case of a voiced speech signal (the inverse of the fundamental frequency of the signal). However, the signal may also come from a music signal for example, having an overall tone which is associated with a fundamental frequency and a fundamental period that can correspond to said repetition period.

However, the physical properties of the synthesized signal do not match those of the original signal (some frames have been lost) and are the cause of unpleasant auditory defects. This introduces additional errors compared to the original signal. In addition, the energy of the correctly received signal and that of the signal reconstructed from the structure described above may be substantially different. These differences can cause an auditory sensation of "noise jump", where the noise level changes sporadically. For example, for a signal in which the noise signal equates to background noise, the listener would hear jumps in this background noise.

More generally, we note that in the current state of the art, the generation of the synthesis signal to fill the frames replacing lost frames introduces a periodicity which, in complex signals such as music, does not fit with the range of all signal components to be replaced.

For example, with reference to FIG. 1C, a signal $S_0$ is repeated 7 times in windows $F_1$ to $F_7$. As the time characteristics (window start times $v_1$ to $v_7$ and window duration $L_0$ to $L_7$) of the windows are identical, periodization is introduced.

This systematic and inadequate periodization results in a "metallic" and artificial sound (therefore unpleasant to the listener) with each frame loss. It is therefore necessary to improve existing replication methods, including but not limited to contexts of decoding with overlap-add.

SUMMARY

The present invention improves the situation.

For this purpose, it proposes a method for processing a digital signal, implemented during decoding of that signal, in order to replace a succession of samples lost during decoding, the method comprising the steps of:

- generating a structure of a signal for replacing the lost succession, this structure comprising spectral components determined from valid samples received during decoding and prior to the succession of lost samples,
- generating a residue between a digital signal available to the decoder, comprising valid samples received, and a signal generated from the spectral components,
- extracting blocks from the residue.

In particular, window-weighted blocks are injected into the structure using an overlap-add approach, the injected blocks at least partially overlapping in time.

Thus, the injection of blocks makes it possible to fill lost frames with no perceptible loss of signal energy. The injection of blocks smooths the signal energy, artificially restoring the spectral density to a constant level. The set of injected blocks corresponds for example to a noise signal injected into the replacement signal. In particular, overlap-adds make it possible to smooth the energy transitions of the noise signal in transition regions.

In addition, the invention proposes reinjecting the various extracted blocks without pronounced periodicity, thus avoiding an audible "metallic" effect related to a simple repetition of the residue. In particular, partial overlaps of the blocks reduce periodization effects, as the transition of the noise signal between two successive blocks is smoothed. Such overlapping makes it more difficult to distinguish the transition from one period to another, thereby limiting the periodization effects.

The term "structure of a replacement signal" is understood to mean a set of characteristics specific to the replacement signal such as, for example, the spectral components of this signal, the amplitudes associated with these spectral components, the phases associated with these components, etc.

The block overlap is at least partial, as a block may for example be completely overlapped in a complementary manner by its two neighboring blocks. In another example, the first block is completely overlapped by the beginning of the second.

In one particular embodiment, the structure of the replacement signal may comprise spectral components determined from valid samples received during decoding and prior to the succession of lost samples. Thus, a replacement signal can easily be regenerated, particularly for a period of time different from the one from which the spectral components were determined.

In addition, the residue can be generated from a residue between a portion of the digital signal containing valid samples received and a signal generated from the spectral components described above. Thus, the blocks extracted from this residue are adapted to the signal to be reconstructed, in that the missing energy components are injected into the replacement signal. Indeed, the spectral components of the injected blocks correspond exactly to the spectral components missing in the signal generated from the structure of the replacement signal described above. The spectral density of the signal into which the blocks are injected then corresponds to the spectral density of the previous signal for which frames have been correctly received. The signal energy is thus advantageously harmonized (between the correctly received signal portions and the reconstructed portions).

In another embodiment, as the blocks are defined by an extracted block start time and a block duration, at least one parameter among this extracted block start time and this block duration may be variable between at least two extracted blocks.

Alternatively, the blocks are injected with at least one parameter that is variable between at least two injected blocks, the variable parameter being one among:

- a write start time of the injected block, and
- an overlap rate between two successive injected blocks.

For example, inconsistencies are introduced into the signal replacing the lost samples. The variability of the parameters mentioned above eliminates the periodization of the signal. If these parameters vary, the signal is no longer repeated identically after a constant interval of time. The impression of metallic sound caused by repetition of the noise signal is thus eliminated. A determination according to predetermined rules that is pseudo-random, or pseudo-random with at least one condition, may for example be the cause of such variability of these parameters.

In another alternative, at least one of the parameters among those described above may vary pseudo-randomly for at least one injected block.

The term "pseudo-random" is understood to mean a series of numbers that approximates statistically perfect randomness. By virtue of the algorithmic processes used to generate it and the sources used, the series cannot be considered as completely random. Conditions may also be considered in conjunction with the pseudorandom determination of at least one parameter. For example, an average of all the determined parameters can be fixed. In this situation, for example, the parameters derived pseudo-randomly and having the effect of establishing the average of a predetermined interval can be distinguished. The choice of parameter variability (pseudo-random, pseudo-random with condition, preset rules, etc.) can itself meet conditions such as the number of samples lost in decoding, the quality level of the signal desired by the user, the resources available for reconstruction calculations, etc.

Thus generated, the abovementioned parameters introduce inconsistencies in the noise signal that render the artificial nature of the injected noise imperceptible. The introduction of pseudo-randomly generated parameters means it is very unlikely there will be any phenomenon of habituation of the ear to a repetition order in the noise signal. There is no logic present between the different weighting windows. A listener will therefore not be annoyed by an impression of repetition in the noise signal (for example background noise).

In another embodiment, the parameters mentioned above for the extraction of blocks and/or the injection of blocks are fixed in advance. Predefined blocks are thus used, which simplifies calculations and reduces the processing time while reducing the load on the processor or processors used for these calculations.

In one embodiment, the sum of the weighting windows applied to two successive injected blocks is equal to one for the overlap segment between these two blocks. Thus, the amplitude of the replacement signal is constant and no transition artifact between two blocks disrupts the signal.

In another embodiment, the sum of the squares of the weighting windows, applied to two successive injected blocks, is equal to one for the overlap segment between these two blocks. Thus, the energy of the replacement signal is constant and the energy of the signal is constant over time.

In one embodiment, one can change the sign of at least one injected block. The block to be reversed is chosen for example pseudo-randomly, pseudo-randomly with at least one condition (modifying a maximum number of windows, for example), or by a predetermined rule (every other window, all windows of a certain length, etc.). Additional inconsistencies are thus added to the noise signal. Also, this addition of inconsistencies occurs without increasing the complexity of the steps for generating the replacement signal. Inversion of the noise signal does not require significant computational resources and this reduces the processing time while decreasing the load on the processor or processors used for these calculations.

In one variant, at least one injected block is time-reversed. The term "time-reversed" is understood to mean the application, to a block b dependent on time t in a weighting window [DF; FF], of a formula: $b(t)=b(FF+DF-t)$. New inconsistencies are thus introduced into the replacement signal.

In another embodiment, the blocks are first injected into an intermediate noise signal, this intermediate noise signal itself being subsequently injected into the structure once all blocks have been injected into the intermediate noise signal. Thus, the noise signal to be injected into the replacement signal is generated in its entirety before being injected. This makes it possible to establish verification mechanisms for the intermediate sound signal before it is injected into the replacement signal.

Alternatively, the blocks are injected in real time without waiting for an entire intermediate noise signal to be generated. Injection in "real time" is then understood to mean an injection of the blocks at a rate adapted to the temporal evolution of the signal. In this situation, the time lag between the signal received by the decoder and the signal delivered to the listener's ear is as small as possible. For example, a replacement signal structure is generated at the beginning of the succession of samples lost in decoding, then the blocks are injected as the signal progresses over time, without an intermediate noise signal being generated in its entirety then injected into the replacement signal.

The invention also provides a computer program comprising instructions for implementing the above method. For example, one or more of FIGS. 5 to 8 can be the general algorithm of such a computer program.

The invention may be implemented by a device for decoding a signal comprising a succession of samples divided into successive frames, the device comprising means for replacing at least one lost signal frame, comprising means for:

- generating a structure of a signal for replacing the lost succession, this structure comprising spectral components determined from valid samples received during decoding and prior to the succession of lost samples,
- generating a residue between a digital signal available to the decoder, comprising valid samples received, and a signal generated from the spectral components,
- extracting blocks from the residue,
- injecting blocks into the structure, wherein the injection means make use of window-weighted blocks in an overlap-add approach, the injected blocks at least partially overlapping in time.

Such a device may take the physical form, for example, of a processor and possibly a working memory, typically in a communication terminal.

BRIEF DESCRIPTION OF THE DRAWINGS

Other features and advantages of the invention will become apparent upon reading the following detailed description of some embodiments of the invention and upon reviewing the drawings in which.

DETAILED DESCRIPTION

Figure 1A:
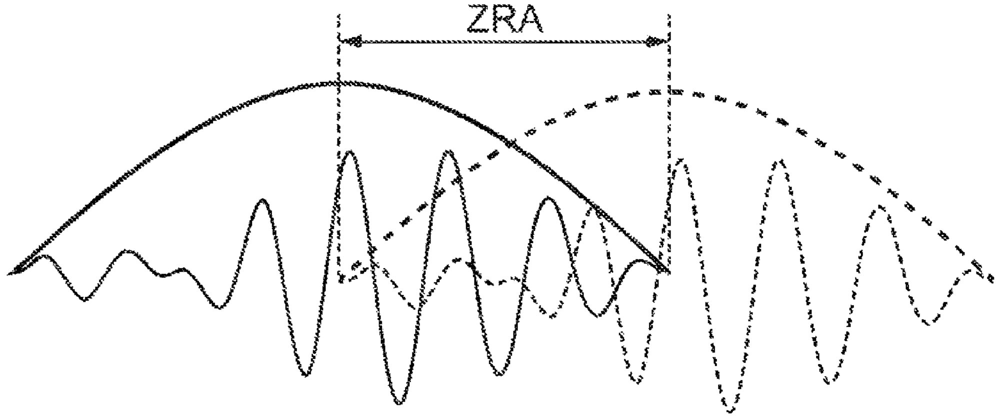
FIG. 1A illustrates overlapping with conventional windows in an MLT transform.
Figure 1B:
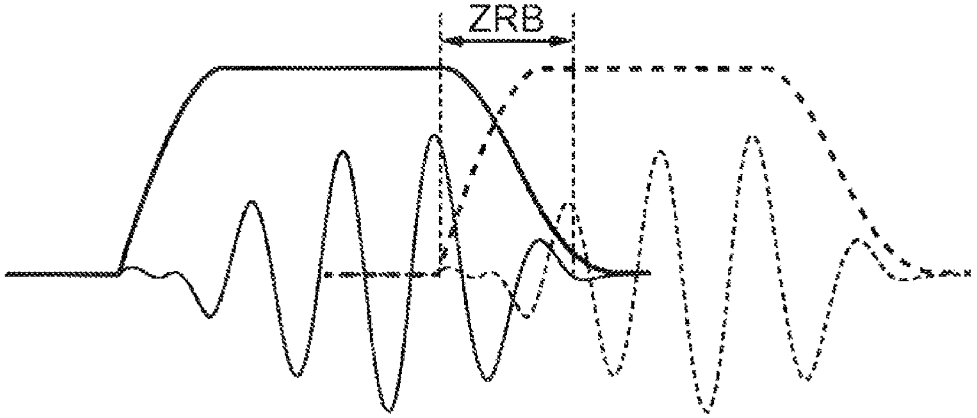
FIG. 1B illustrates overlapping with low-delay windows, for comparison to the representation in FIG. 1A.
Figure 1C:
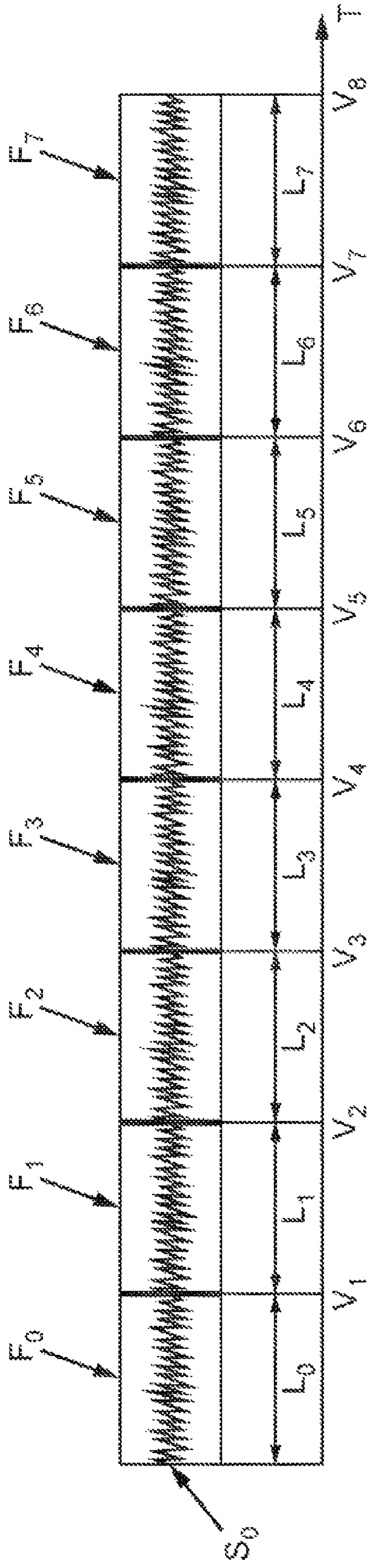
FIG. 1C shows a periodic replication of a noise signal.
Figure 2:
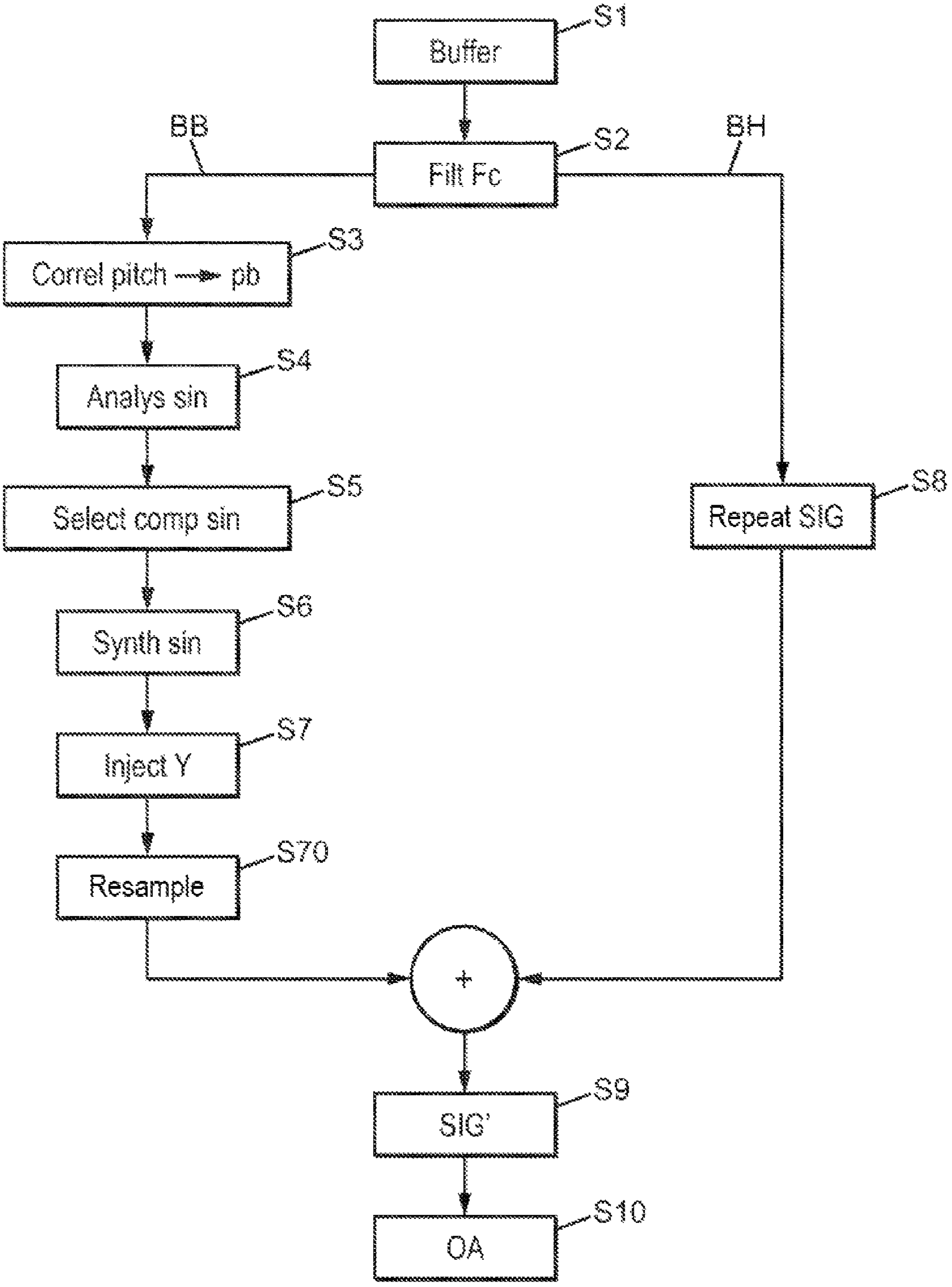
FIG. 2 represents an example of a technical framework in which the invention can be implemented, FIG. 3 schematically represents a device comprising means for implementing the method according to the invention.

We will now refer to FIG. 2 to describe an advantageous but optional context for implementing the invention. This relates to processing which is implemented in a decoder for a received signal. The decoder can be of any type, the processing as a whole being generally independent of the type of encoding/decoding. In the example described, the processing is applied to a received audio signal. However, it can be applied more generally to any type of signal analyzed by time-windowing and transformation, with harmonization to be performed with one or more replacement frames during synthesis using an overlap-add approach.

The term "frame" is understood to mean a block of at least one sample. In most codecs, these frames consist of several samples. However, in some codecs, such as PCM (Pulse Code Modulation), for example according to Recommendation G.711, the signal simply consists of a succession of samples (a "frame" in the meaning of the invention then containing only one sample). The invention can then also be applied to this type of codec.

For example, the valid signal can consist of the last valid frames received before the frame loss. It is also possible to use one or several subsequent valid frames received after the lost frame (although such an embodiment results in a delay in decoding). The samples used from the valid signal may be those of the frames directly, and possibly those which correspond to the memory of the transform and which typically contain aliasing in the case of transform decoding with MDCT or MLT overlapping.

In a first step S1 of the processing of FIG. 2, N audio samples are sequentially stored in a buffer (such as a FIFO buffer). These samples correspond to samples already decoded and thus accessible when processing the frame loss(es). If the first sample to be synthesized is the sample of time index N (of one or more consecutive lost frames), the audio buffer b(n) corresponds to the N previous samples of time indices 0 to N−1.

In the filtering step S2, the audio buffer b(n) is then separated into two frequency bands, a low frequency band BB and a high frequency band BH with a separation frequency denoted below as Fc, with for example Fc=4 kHz.

Step S3, applied to the low frequency band, consists of then searching for a loopback point and a segment of length P corresponding to the fundamental period in the buffer b(n) resampled with frequency Fc. The fundamental period corresponds for example to a pitch period in the case of a voiced speech signal (the inverse of the fundamental frequency of the signal). However, the signal may also originate from a music signal for example, having an overall tone which is associated with a fundamental frequency and a fundamental period that can correspond to said repetition period.

In what follows, it is assumed that only one fundamental period of length P is used for synthesis of the signal, but it should be noted that the principle of the processing applies equally well for a segment extending over several fundamental periods. The results are even better with several fundamental periods, in terms of accuracy of the FFT and the wealth of spectral components obtained.

The next step S4 consists of breaking segment p(n) down into a sum of sines.

In step S5 of FIG. 2, the sinusoidal components are selected so that only the most important components are retained.

The next step S6 is a sinusoidal synthesis. In one exemplary embodiment, it consists of generating a segment s(n) of a length at least equal to the size of a lost frame (T). In one particular embodiment, a length equal to 2 frames (for example 40 ms) is generated so as to be able to do a crossfade type of audio mixing (as a transition) between the synthesized signal (with frame loss correction) and the signal decoded in the next valid frame when such a frame is once again correctly received.

To anticipate the resampling of the frame (length of samples denoted LF), the number of samples to be synthesized can be increased by half the size of the resampling filter (LF). The synthesized signal s(n) is calculated as a sum of the selected sinusoidal components:

$$s(n) = \sum_{k=0}^{k=K} A(k)\sin(\pi f(k)n + \varphi(k)) \quad n \in \left[0;\, 2T + \frac{LF}{2}\right]$$

where k is the index of the K components selected in step S5. There are several possible conventional methods for performing this sinusoidal synthesis.

Step S7 of FIG. 2 consists of injecting noise to compensate for the energy loss due to the omission of certain frequency components in the low frequency band.

Figure 5:
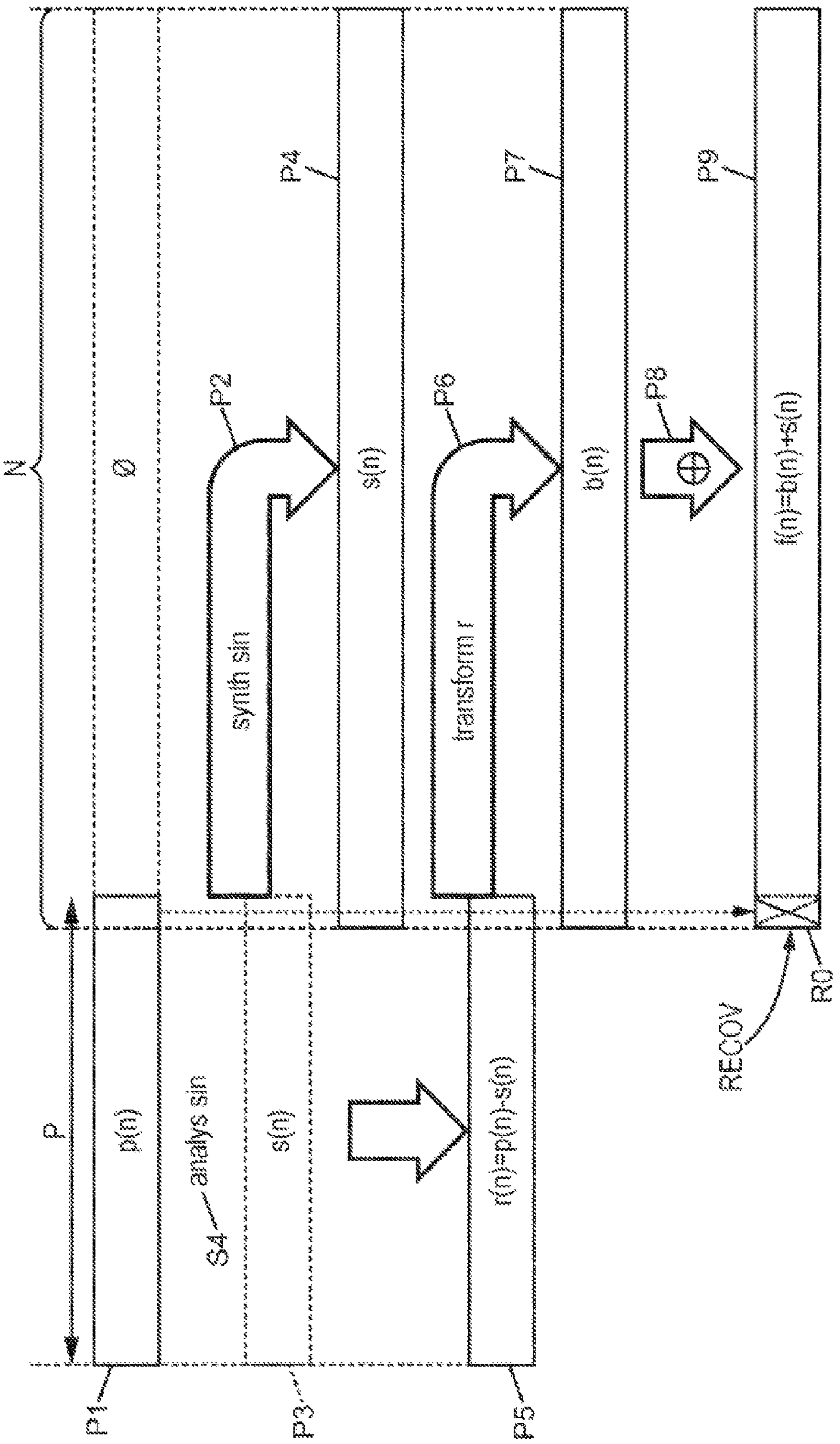

One simple embodiment of the invention can already be described with reference to FIG. 5. It consists of computing in step P5 the residue r(n)=p(n)−s(n) between the signal block p(n) corresponding to the pitch extracted in step P1 and the synthesized signal s(n) generated in step P3 from the sinusoidal analysis made in step S4, with: n∈[0; P−1].

This residue is transformed in step P6 so that it reaches a size $$2T + \frac{LF}{2},$$

to become signal b(n) in step P7.

Signal b(n) is then injected, in step P8, into signal s(n) generated in step P2, for a duration N corresponding to the duration of the signal to be replaced.

This replacement signal f(n) is then mixed with the valid signal in step P9. The mixing may for example include overlap-adding RECOV over an overlap interval RO.

In one embodiment, this residual signal is replicated one or more times (depending on the portion of time to be filled), with overlap-add between replicas.

In another embodiment, various transforms may be applied to the blocks of the residual signal in a pseudo-random manner at each replication: it is thus possible to reverse the sign of the signal, and/or perform a time reversal.

Figure 4:
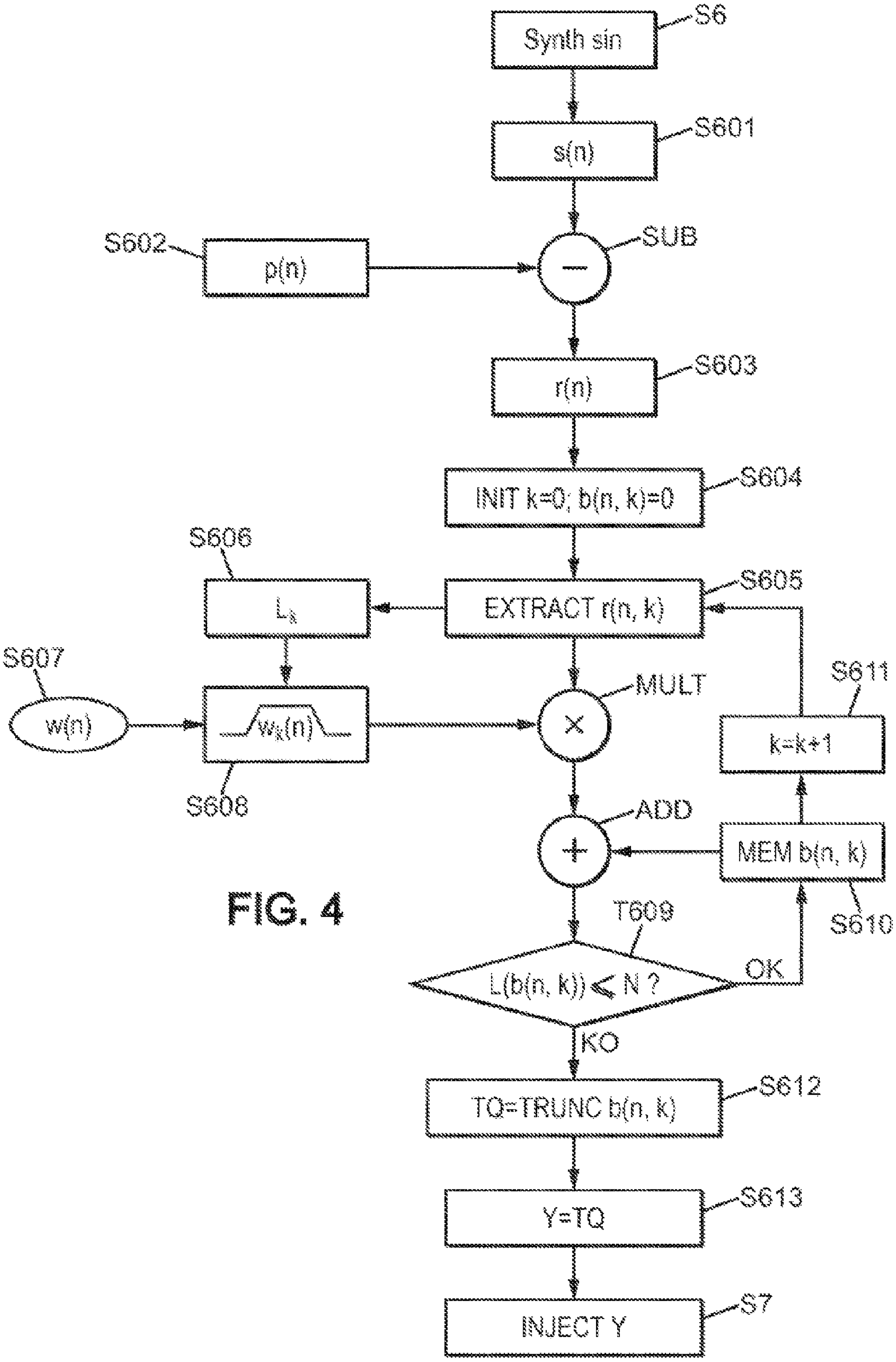
FIG. 4 represents an example of the general processing of the invention, FIG. 5 schematically illustrates the steps of a method of the invention, in one embodiment, FIG. 6 schematically illustrates the steps of a method of the invention, in another embodiment, FIG. 7 schematically illustrates the steps of a method of the invention, in another embodiment, FIG. 8 schematically illustrates the steps of a method of the invention, in another embodiment.

We will now describe, with reference to FIG. 4, a method for generating a noise signal to be injected into a structure of a replacement signal, according to one embodiment of the invention.

In step S601, a signal s(n) is generated from the sinusoidal synthesis of step S6 (also referenced in FIG. 2) over a period of time corresponding to that of the block p(n) extracted in step S602.

The residue r(n) is obtained by subtracting SUB signal s(n) from signal p(n). This yields, in step S603, r(n) such that r(n)=p(n)−s(n).

In step S604, a counter variable k is initialized to 0 and signal b(n,k) is initialized such that b(n,0)=0.

In step S605, a block r(n,k) is extracted from signal r(n). In one embodiment, the temporal characteristics (start time of block $i_k$ and duration of block $L_k$) of this extraction are determined pseudo-randomly. In another embodiment, conditions may be imposed for this extraction. For example, the sum of the value of the block start time and the value of the duration must be less than the value of the duration corresponding to that of block p(n) extracted in step S602.

In step S606, the duration $L_k$ of the extracted block r(n,k) is transmitted for a window configuration step S608.

In step S607, a set of weighting windows is made available so that a weighting window can be configured in step S608. For example, weighting windows stored in memory are extracted and transferred to a working memory.

In step S608, a weighting window is selected and configured so that it can be multiplied by block r(n,k) in step MULT. The parameters of the window include the duration $L_k$ appropriate for block r(n,k).

Block $w_k \cdot r(n,k)$ is then added with overlapping to signal b(n,k−1), corresponding to the (k−1) blocks already added, such that $b(n,k)=w_k \cdot r(n,k)+b(n,k-1)$. In one embodiment, the overlap-adding is performed with a fixed overlap rate of 50%.

Test T609 verifies that the length of the signal b(n,k) already generated is not greater than the value N corresponding to the duration of the signal to be replaced.

If it is, signal b(n,k) is truncated so that the temporal length of b(n,k) is equal to the value N corresponding to the duration of the signal to be replaced in step S612, the truncated value being denoted TQ. In step S613, the noise signal Y to be injected into the replacement signal for the lost frames is set to TQ and is injected in step S7 (also referenced in FIG. 2).

If it is not, the value of b(n,k) is stored in a working memory MEM (with reference to FIG. 3) to be subsequently added to the next block r(n,k+1). In step S611, the counter variable k is incremented and the procedure returns to step S605.

Figure 6:
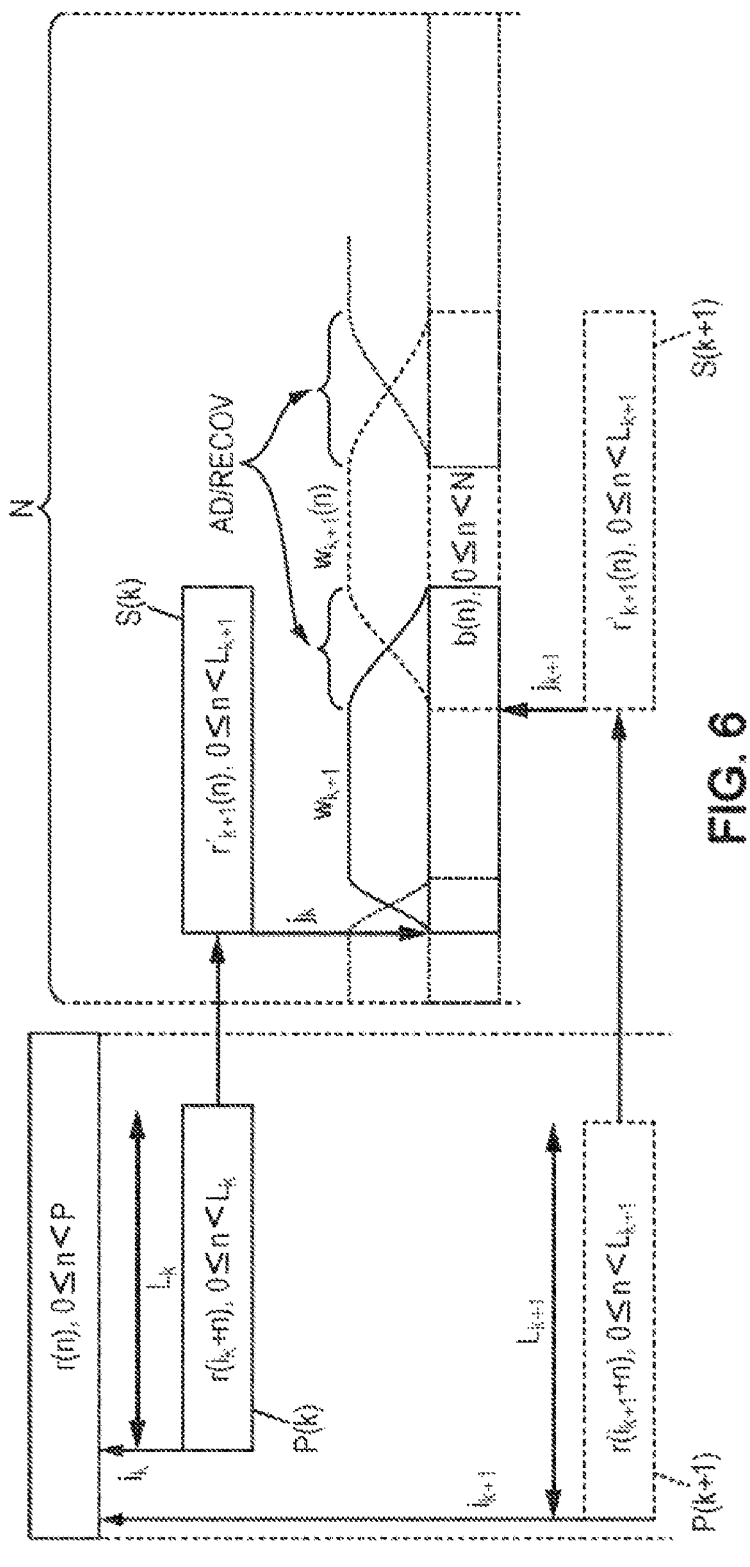

We will now describe, with reference to FIG. 6, a method for generating a noise signal to be injected into a structure of a replacement signal, according to another embodiment of the invention.

In this embodiment, the residual signal is injected in successive iterations (numbered k) of overlay-adding signal blocks $r_k'(n)$ obtained from the residue r(n).

At iteration k, the block read is determined by a block start index $i_k$ and a block length $L_k$, and the manner of injecting this residue portion into the target time slot is defined by determining an optional transformation $T_k$, a write index $j_k$ (start of copying the block in the time slot to be filled), and overlap-add window $w_k(n)$.

We will denote the complementary signal as b(n), of size N samples, to be generated from the residue. The procedure for generating the noise signal is described as follows.

Initialization:

$b(n)=0,\ 0 \le n < N$ $k=0$ $j_0=0$

Iterations, until $j_k+L_k=N$:

1) choice of $i_k$ and $L_k$ such that $i_k+L_k \le P$ and $j_k+L_k \le N$, and extraction of block P(k),
2) choice of a transformation $T_k$ to obtain S(k) corresponding to $r_k'(n)=T_k(r_k(i_k+n))$. This transformation is described below,
3) if $j_k+L_k<N$, in order to prepare the overlap with the next iteration, choice of $j_{k+1} \le j_k+L_k$ (and preferably $j_{k+1} \ge j_{k-1}+L_{k-1}$ to limit the simultaneous overlap to two blocks at most, for example S(k) and S(k+1)), and extraction of block P(k+1),
4) determination of the weighting window $w_k(n)$ based on any overlaps with neighboring blocks,
5) pasting of $r_k'(n)$ weighted by window $w_k(n)$: $b(j_k+n)=b(j_k+n)+r_k'(n)\cdot w_k(n),\ 0 \le n \le L_k$, and
6) incrementation of k=k+1.

In this embodiment, the described procedure increases write index $j_k$. Any other choice of progression (decreasing, non-monotonic, etc.) is also possible.

Figure 11:
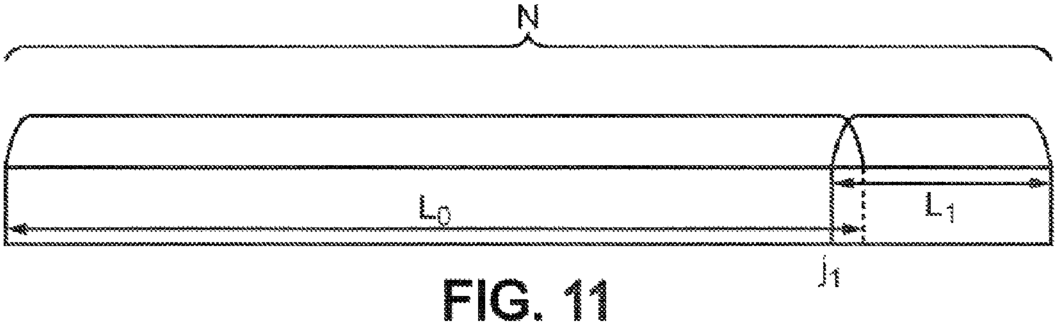
FIG. 11 shows successive weighting windows of the invention, determined according to one embodiment.

In another embodiment, $L_k$ is chosen to be relatively large compared to the available reserve P, in order to be able to progress significantly in copying, and to avoid distorting relatively low frequency components. For example, referring to FIG. 11, $L_0$ is chosen to be relatively large so that only one overlap-add is applied.

In another embodiment, the size $j_k+L_k-j_{k+1}$ of the overlap areas is reduced to limit the number of addition and multiplication operations required. Adjustment of the overlap rate (corresponding to the size $j_k+L_k-j_{k+1}$ of the overlap areas) can also be configured so that the ratio between quality (erasing artifacts) and the processing cost are adapted to the planned use of the decoder.

Figure 7:
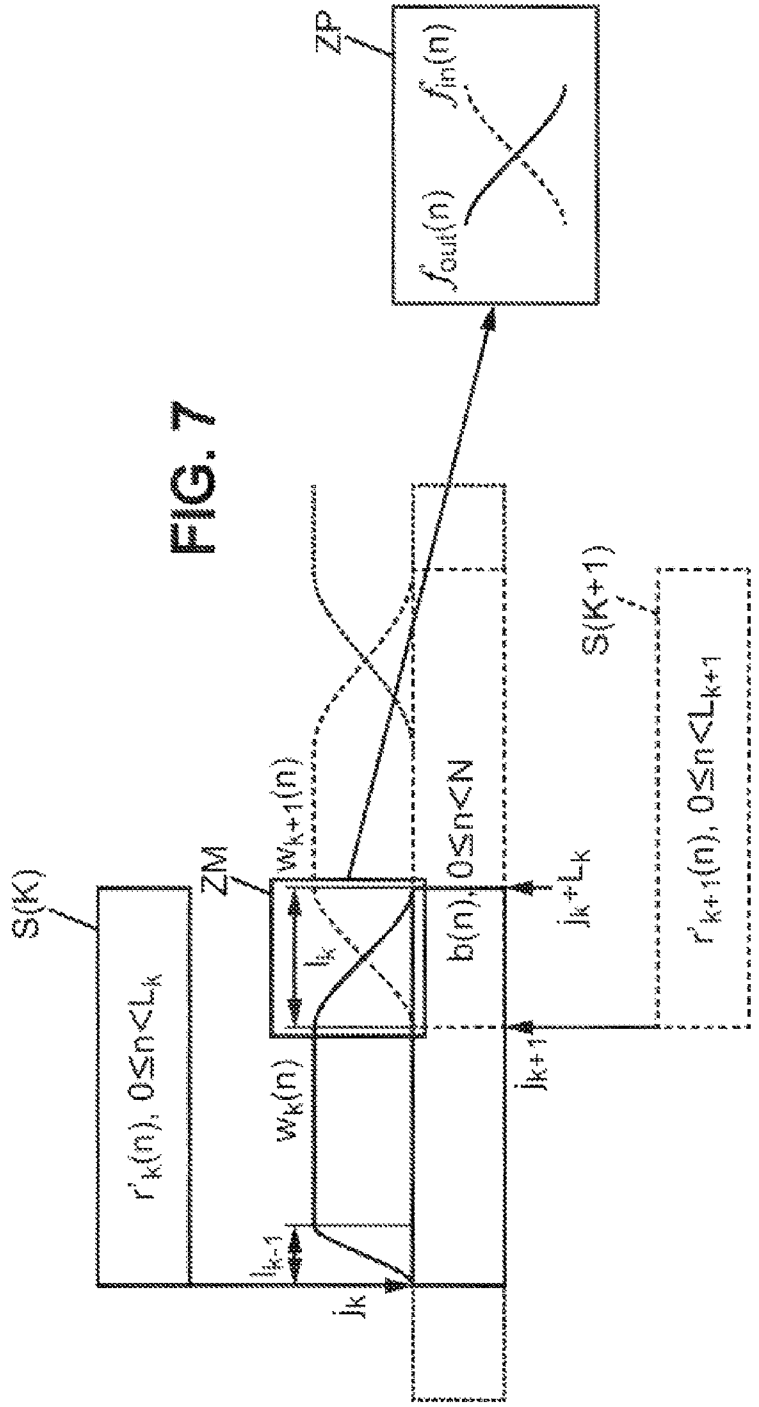

In one preferred embodiment, with reference to FIG. 7, the weighting windows are defined so as to ensure a smooth transition between pasted portions as well as continuity in terms of signal energy in the resulting signal. Typically, it is planned to have a maximum of two blocks that overlap at any point. Let us consider the overlap between blocks S(k) and S(k+1). Box ZP represents an enlargement of boxed area ZM in FIG. 7.

In the overlapping area, meaning for $n \in [0;\ l_k[$ where $l_k=j_k+L_k-j_{k+1}$, the resulting signal is:

$$b(j_{k+1}+n)=r_k'(j_{k+1}-j_k+n)\cdot w_k(j_{k+1}-j_k+n)+r_{k+1}'(n)\cdot w_{k+1}(n)$$

In one embodiment, the end of $w_k$ and the start of $w_{(k+1)}$ are combined according to a criterion called "preservation of amplitude":

$$w_k(j_{k+1}-j_k+n)+w_{k+1}(n)=1$$

It is thus sufficient to choose a crossfade function $f_{l_k}(n)$, typically increasing and bounded by 0 and 1, and to deduce from it for $n \in [0;\ l_k[$:

$$w_k(j_{k+1}-j_k+n)=f_{out}(n)=1-f_{l_k}(n),\text{ and}$$

$$w_{k+1}(n)=f_{in}(n)=f_{l_k}(n).$$

For example, the crossfade function can be refined and defined by:

$$f_{l_k}(n)=\frac{n+0.5}{l_k}$$

In another example, represented by function $f_{in}(n)$ in FIG. 7, the crossfade function can be sinusoidal and defined by:

$$f_{l_k}(n)=\left(\sin\left(\frac{n+0.5}{l_k}\frac{\pi}{2}\right)\right)^2$$

In another embodiment, a criterion called "energy conservation" is selected, where the pasted signals can be combined without phase coherence, and defined by:

$$(w_k(j_{k+1}-j_k+n))^2+(w_{k+1}(n))^2=1$$

From a crossfade function $f_k(n)$ as proposed above, one can then deduce for $n \in [0;\ l_k[$:

$$w_k(j_{k+1}-j_k+n)=f_{out}(n)=\sqrt{1-f_{l_k}(n)},\text{ and}$$

$$w_{k+1}(n)=f_{in}(n)=\sqrt{f_{l_k}(n)}.$$

Each weighting window is typically composed of three parts, from left to right:

- an increasing part (complementary to the decreasing part of the previous window),
- a constant and conservative part (gain of 1), and
- a decreasing part.

In one embodiment, at least one of these parts is of zero length for at least one weighting window. For example, the weighting window applied to the first injected block consists only of a decreasing part if this first block is completely overlapped by the beginning of the next injected block.

In another embodiment, the crossfade effect for two blocks is managed simultaneously over their overlapping area. This involves simply breaking apart the steps described above and reassembling them differently.

Each iteration then consists of:

- a phase of pasting without overlap and thus without windowing (eliminating the multiplication by $w_k(n)=1$), and/or
- a phase of crossfade pasting of the end of the old block and the beginning of the new block, using the crossfade functions $f_{out}(n)$ and $f_{in}(n)$ described above.

This is described in more detail with the following procedure, referred to as "with simultaneous crossfade."

Initialization:

$b(n)=0,\ 0 \le n < N$ $k=0$ $j_0=0$ $l_{-1}=0$

Choice of $i_0$ and $L_0$ such that $i_0+L_0 \le P$ and $j_0+L_0 \le N$

Choice of $j_1 \ge j_0$ where $j_1 \le j_0+L_0$, from which the size of the overlap is deduced $l_0=j_0+L_0-j_1$ Choice of transformations $T_0$ and $T_1$ Calculation of $r'_0=T_0(r_0(i_0+n))$ Iterations, until $j_k+L_k=N$:

1) If $j_{k+1}>j_k+l_{k-1}$, pasting without overlap or windowing:

$$b(j_k+n)=r_k'(n),\ l_{k-1} \le n < L_k-l_k$$

2) Crossfade pasting in the overlap area:

$$b(j_{k+1}+n)=r_k'(L_k-l_k+n)\cdot f_{out}(n)+r_{k+1}'(n)\cdot f_{in}(n),\ 0 \le n < l_k$$

3) If another iteration is required (particularly if $j_k+L_k<N$),
   a) choice of $j_{k+1} \le j_k+L_k$ where $j_{k+1} \ge j_{k-1}+L_{k-1}$ (to limit simultaneous overlap to two blocks at most)
   b) Choice of $i_{k+1}$ and $L_{k+1}$ such that $i_{k+1}+L_{k+1} \le P$ and $j_{k+1}+L_{k+1} \le N$
   c) Choice of transformation $T_{k+1}$ to obtain $r_{k+1}'(n)=T_{k+1}(r_{k+1}(i_{k+1}+n))$ (see details below)
4) Incrementation of $k=k+1$ In a variant, the principle of crossfading is applied between the new pasted block and the signal already generated in the overlapping portion: $b(j_{k+1}+n)=b(j_{k+1}\ n)f_{out}(n)+r'_{k+1}(n)\cdot f_{in}(n)$. This embodiment has the advantage of managing simultaneous overlaps of more than two blocks without increasing the complexity of the calculations.

Thus, at least one of the parameters $i_k$, $l_k$, $L_k$ and $T_k$ varies from one iteration to another, in order to avoid a periodicity effect and the associated auditory artifacts (metallic, artificial sound).

One can deduce the indices $i_k$, $i_{k+1}$, $j_k$ and $j_{k+1}$ delay information $d_{k,k+1}$ of one pasted block relative to another, in the filled time slot: $d_{k,k+1}=(j_{k+1}-i_{k+1})-(j_k-i_k)$.

In a preferred but non-limiting manner, $d_{k,k+1}$ is set so that it is different from one iteration k to the next k+1.

In one embodiment, to improve the erasing of artifacts, simple or complex transformations (denoted $T_k$ above) can be introduced in a variable manner during iterations, offering the advantage of introducing a form of decorrelation between injected signal portions.

One possible and simple transformation $T_k$ consists of changing the sign of the signal: $r_k'(n)=T_k(r_k(i_k+n))=\sigma_k r_k(i_k+n)$ where $\sigma_k=\pm 1$ depending on the iteration.

One possible transformation, which can be combined with the previous one and is applicable pseudo-randomly, consists of a time reversal, meaning the reading or writing of the residue in a retrograde manner:

$$r_k'(n)=T_k(r_k(i_k+n))=\sigma_k r_k(i_k+L_k-1-n),\ 0 \le n < L_k$$

Other transformations which are more complex in their computation cost are also possible, for example phase-shifting filters. A phase-shifting filter, also called an all-pass filter, presents an identical gain over the entire frequency range used, but the relative phase of the frequencies making up the signal varies with the frequency.

Although an intermediate variable $r_k'(n)$ is introduced here to facilitate the description, the transformation $T_k$ in question can be done as a particular mode for reading digital samples without necessarily requiring intermediate storage in a buffer between reading from r(n) and writing to b(n).

In another embodiment, the $k^{th}$ signal portion injected can be obtained from the complementary signal already generated b(n), $0 \le n < j_{k-1}+L_{k-1}$, and no longer only from the residue r(n).

Figure 8:
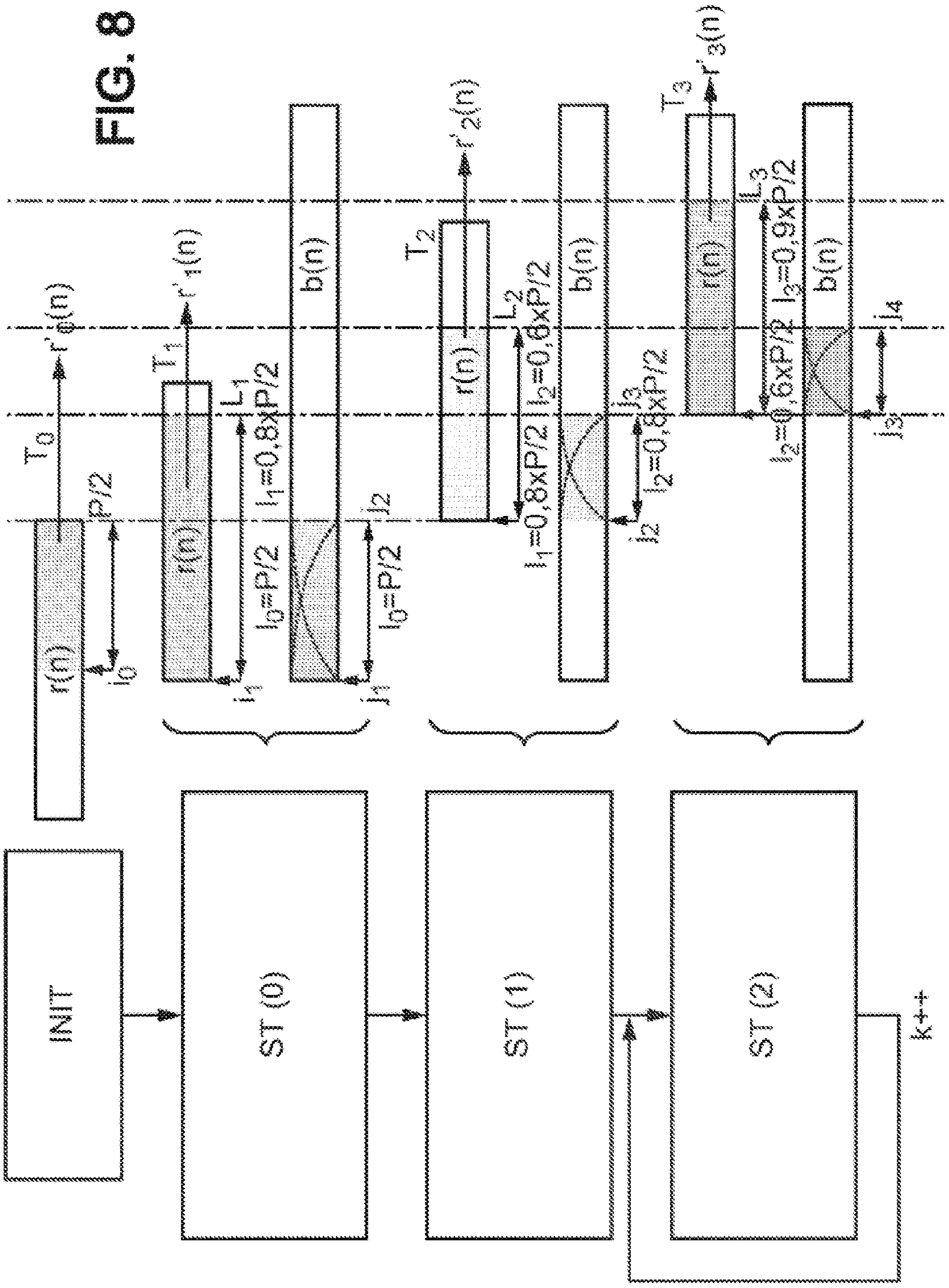

One variant embodiment comprising the procedure "with simultaneous crossfade" described above, incorporated into a digital audio decoder, is now given as an example with reference to FIG. 8.

Initialization:

$j_1=j_0=0$: the crossfade of two blocks is applied the moment filling starts $i_0=P/2$ $L_0=P/2$ In each iteration The read index $i_k$ (for k>0) points to the start of the calculated residue segment r(n): $i_k=0$.

The crossfade functions are sinusoidal:

$$f_{out}(n)=1-f_{l_k}(n)$$

$$f_{in}(n)=f_{l_k}(n)$$

with $$f_{l_k}(n)=\left(\sin\left(\frac{n+0.5}{l_k}\cdot\frac{\pi}{2}\right)\right)^2.$$

There is simultaneous overlap of two blocks, therefore: $j_{k+1}=j_k+l_{k-1}=j_{k-1}+L_{k-1}$ for k>0.

The complete size of each pasted block corresponds to the total of two joint overlap areas $L_k=l_{k-1}+l_k$, and it is then the size $l_k$ of the overlap area that is determined in each iteration, from which is deduced $L_k$ as well as $j_{k+1}$. This parameter $l_k$ is calculated in proportion to the half-size P/2 of the available residue, such that:

$$l_k=\lfloor \alpha(k')\cdot P/2 \rfloor$$

with k'=mod (k+cnt_bfi) where $cnt_{bfi}$ is the counter for the number of missing frames and $\alpha$=[1 0.8 0.6 0.9].

The transformation $T_k$ essentially consists of an occasional change of sign (no time reversal), indicated by the coefficient $$\sigma_k=\begin{cases}1 & \text{for even } k\\ -1 & \text{for odd } k\end{cases}.$$

The first steps of the method described above are presented in the following table, with reference to FIG. 8. Step INIT corresponds to initialization of this method and steps ST(0), ST(1), and ST(2) to the first incrementations of the method.

| | |
|---|---|
| INIT | $j_2 = j_0 = 0$; $i_0 = P/2$; $L_0 = P/2$; $l_0 = P/2$;<br>calculate $r'_0(n)$ by applying<br>$T_0(\sigma_0 = 1)$ |
| ST(0) | for k = 0, choose: $i_2 = 0$; $l_2 = 0.8 \times P/2$;<br>$L_2 = l_{2+}l_0$<br>calculate $r'_1(n)$ by applying $T_1$ ($\sigma_2 = -1$)<br>calculate $f_{out}(n)$ & $f_{in}(n)$<br>$b(j_1 + n) = r'_0(n)*f_{out}(n) + r'_2(n)*f_{in}(n)$<br>$j_2 = j_1 + l_0$ |
| ST(1) | for k = 1, choose: $i_2 = 0$; $l_2 = 0.6 \times P/2$;<br>$L_2 = l_{2+}l_1$<br>calculate $r'_2(n)$ by applying $T_2$ ($\sigma_2 = 1$)<br>calculate $f_{out}(n)$ & $f_{in}(n)$<br>$b(j_2 + n) = r'_1(L_1 - l_1 + n)*f_{out}(n) + r'_2(n)*f_{in}(n)$<br>$j_3 = j_2 + l_1$ |

-continued

| | |
|---|---|
| ST(2) | for k = 2, choose: $i_3 = 0$; $l_2 = 0.9 \times P/2$;<br>$L_3 = l_3 + l_2$<br>calculate $r'_3(n)$ by applying $T_3$ ($\sigma_3 = -1$)<br>calculate $f_{out}(n)$ & $f_{in}(n)$<br>$b(j_3 + n) = r'_2(L_2 - l_2 + n)*f_{out}(n) + r'_3(n)*f_{in}(n)$<br>$j_4 = j_3 + l_2$ |

Once the complementary signal b(n) is generated for the desired time portion, it is added to the signal generated by sinusoidal synthesis s(n), n>0.

In a preferred embodiment, at least one of the parameters of the blocks is determined pseudo-randomly in order to introduce inconsistencies into the replacement signal and thus limit the periodicity phenomenon which causes auditory unpleasantness. The parameters of the weighting windows are, for example, the extracted block start time, the duration of a block (similar to parameter $L_k$ described above), and the overlap rate of two consecutive blocks.

Figure 9A:
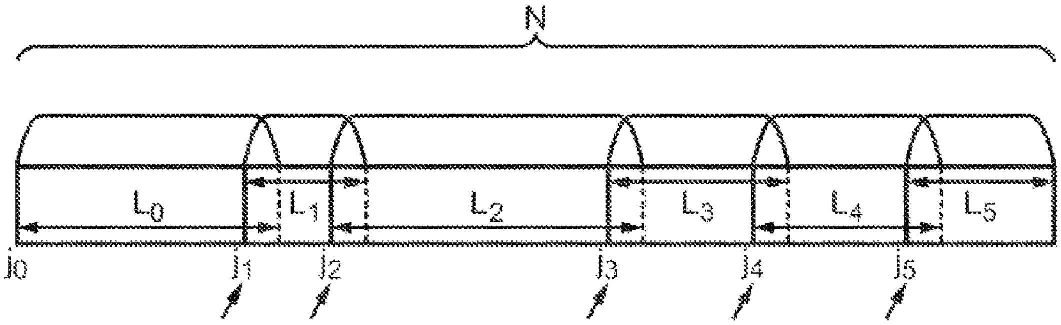
FIG. 9A shows successive weighting windows of the invention for a constant overlap rate, determined according to one embodiment.

In one exemplary embodiment, with reference to FIG. 9A showing the noise signal injected into the replacement signal once all blocks are injected, the start times for writing injected blocks are determined pseudo-randomly with a constant overlap rate. In FIGS. 9A to 11, the arrows indicate parameters determined pseudo-randomly. As the first two parameters (block start time and overlap rate) are fixed, the block duration is deduced from these first two parameters. Other conditions may also come into play. For example, the sum of the lengths of each block may be fixed such that the block does not exceed a duration N corresponding to the duration of the signal to be replaced. This condition can be expressed differently by considering that the sum of the start index of the last block plus the length of the last block can be set so that it is smaller than the duration N. In practice, in a method for generating noise by successive iterations, these conditions can be checked at each overlap-add.

For example, for 10 frames of lost data to be replaced, the noise signal is weighted by 20 weighting windows.

As stated above, the term pseudo-random is used in mathematics and computer science to designate a sequence of numbers that approximates statistically perfect randomness. By virtue of the algorithmic processes used to generate it and the sources employed, the sequence cannot be considered as completely random. Of course, the parameters can be generated pseudo-randomly but still meet certain conditions, for example conditions relating to the length of the signal to be replaced.

Figure 9B:
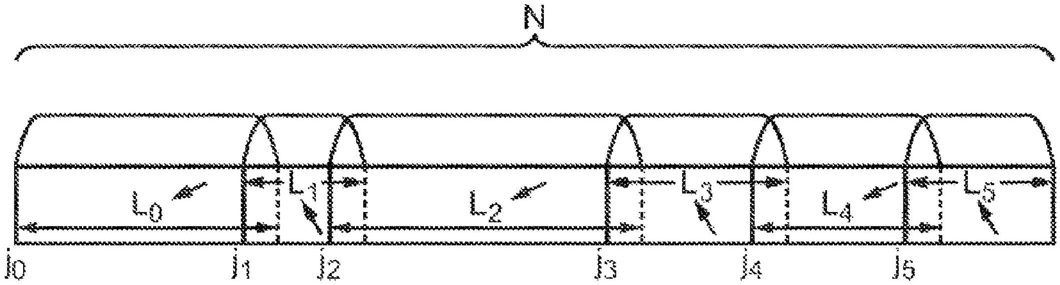
FIG. 9B represents successive weighting windows of the invention for a constant overlap rate, determined according to one embodiment.

In another embodiment, with reference to FIG. 9B, the durations of the blocks ($L_0$-$L_5$) are determined pseudo-randomly with a constant overlap rate. As the first two parameters are fixed, the start index for writing a block is derived from these first two parameters. In this example, none of the parameters of the last block are determined pseudo-randomly, so that the duration of the signal resulting from the overlapping of all the blocks is not greater than the duration N corresponding to the duration of the signal to be replaced.

Figure 9C:
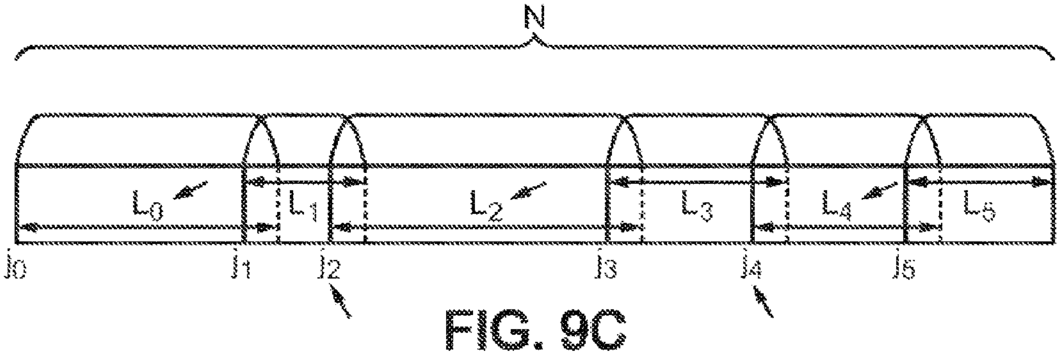
FIG. 9C represents successive weighting windows of the invention for a constant overlap rate, determined according to one embodiment.

In another embodiment, with reference to FIG. 9C, the durations of the blocks and the values of the start indexes for writing injected blocks are determined pseudo-randomly for an even window index, with a constant overlap rate. Thus, $j_0$, $L_0$, $j_2$, $L_2$, $j_4$ and $L_4$ are determined pseudo-randomly and $j_1$, $L_1$, $j_3$, $L_3$, $j_5$ and $L_5$ are deduced from parameters determined pseudo-randomly and from the overlap rate. Conditions may be attached to these parameters so that the duration of the signal resulting from overlapping all the s blocks does not exceed the duration N corresponding to the duration of the signal to be replaced.

Figure 10:
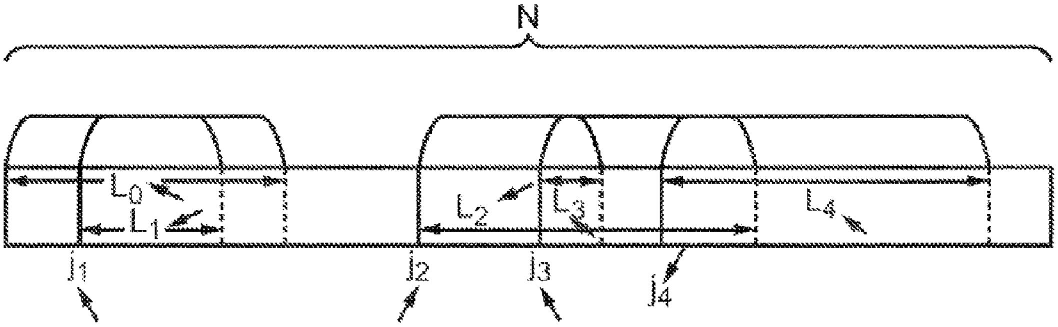
FIG. 10 shows successive weighting windows of the invention for a pseudo-random overlap rate, determined according to one embodiment.

In another embodiment, with reference to FIG. 10, all the parameters are determined pseudo-randomly. However, conditions may be set on these parameters so that the duration of the signal resulting from overlapping injected blocks does not exceed the duration N corresponding to the duration of the signal to be replaced. In this configuration, in particular, the sum of two successive weighting windows is not equal to 1 for the overlay segment between these two windows and the sum of the squares of two successive weighting windows is not equal to 1 for the overlay segment between these two windows.

Next, returning to step S8 of FIG. 2, one may optionally continue with constructing the replacement signal by processing the high frequency band which was not concerned by steps S3 to S7, simply by repeating the signal in this high frequency band.

In step S9, the signal is synthesized by resampling the low frequency band at its original frequency Fc in step S70, and adding it to the signal coming from the repetition of step S8 in the high frequency band.

In step S10, an overlap-add is performed which ensures continuity between the signal before the frame loss and the synthesized signal, and with the synthesized signal and the signal after the frame loss.

Of course, the invention is not limited to the embodiment described above; it extends to other variants.

For example, the separation into high and low frequency bands in step S2 is optional. In an alternative embodiment, the signal from the buffer (step S1) is not separated into two sub-bands and steps S3 to S10 remain identical to those described above. However, the processing of spectral components in the low frequencies advantageously allows limiting the complexity.

Figure 3:
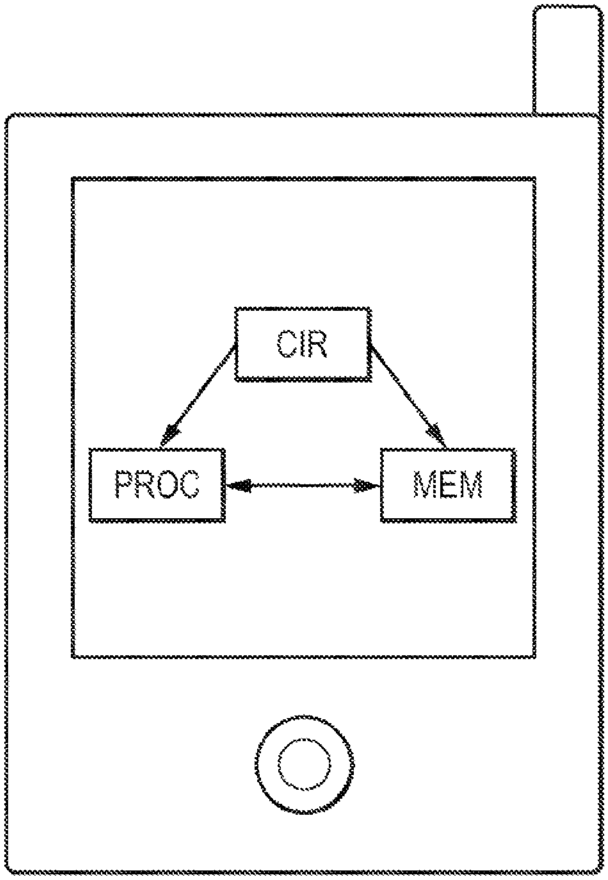

The invention may be implemented in a conversational decoder, in the case of frame loss. Physically, it can be implemented in a circuit for decoding, typically in a telephony terminal. To this end, such a circuit CIR may comprise or be connected to a processor PROC, as illustrated in FIG. 3, and may comprise a working memory MEM, programmed with computer program instructions according to the invention for executing the above method. For example, the invention may be implemented in a decoder by real-time transform.

More particularly, an embodiment has been described above that is based on a method for generating noise from a residue between a known signal and a synthesized signal. Of course, it is also possible to calculate the residue in the frequency domain (eliminating the selected spectral components from the original spectrum) and to obtain background noise by reverse transform.

An embodiment has been described above that is based on a structure comprising spectral components determined from valid samples received during decoding and before the succession of lost samples. Of course, these spectral components may also be determined from samples received after this succession of lost samples. These spectral components may also be determined from samples received prior and subsequent to this succession of lost samples. These spectral components may also be constant.

The invention claimed is:

1. A method for processing a digital audio signal, implemented during decoding of said signal, in order to replace a succession of samples lost during decoding, the method comprising the steps, by a processor of a telecommunication terminal, of:

generating a structure of a signal for replacing the lost succession, said structure comprising spectral components determined from valid samples received during decoding and prior to said succession of lost samples, generating a residue between a digital signal available to the decoder, comprising valid samples received, and a signal generated from said spectral components, extracting blocks from said residue, wherein said blocks are injected into said structure by using an overlap-add approach according to weighting windows, said injected blocks at least partially overlapping in time, wherein said blocks are injected with a parameter that is variable between at least two injected blocks, the variable parameter being one of:

a write start time of the injected block, and an overlap rate between two successive injected blocks, wherein the variable parameter varies pseudo-randomly for at least one injected block.

2. The method according to claim 1, wherein, as said blocks are defined by an extracted block start time and a block duration, at least one parameter among said extracted block start time and said block duration is variable between at least two extracted blocks.

3. The method according to claim 1, wherein, said blocks being defined by an extracted block start time and a block duration, at least one parameter among said extracted block start time and said block duration is determined pseudo-randomly for at least one extracted block.

4. The method according to claim 1, wherein the sum of the weighting windows applied to two successive injected blocks is equal to one for the overlap segment between these two blocks.

5. The method according to claim 1, wherein the sum of the squares of the weighting windows, applied to two successive injected blocks, is equal to one for the overlap segment between these two blocks.

6. The method according to claim 1, wherein the sign of at least one injected block is changed.

7. The method according to claim 1, wherein at least one injected block is time-reversed.

8. The method according to claim 1, wherein said blocks are first injected into an intermediate noise signal, said intermediate noise signal being subsequently injected into said structure.

9. The method according to claim 1, wherein said blocks are injected into said structure in real time.

10. A non-transitory computer-readable storage medium with an executable program stored thereon, wherein the program instructs a microprocessor to perform the method according to claim 1.

11. A device for decoding a digital audio signal comprising a succession of samples divided into successive frames, the device comprising means for replacing at least one succession of lost samples, comprising at least a processor adapted to perform the following steps:

generating a structure of a signal for replacing the lost succession, said structure comprising spectral components determined from valid samples received during decoding and prior to said succession of lost samples, generating a residue between a digital signal available to the decoder, comprising valid samples received, and a signal generated from said spectral components, extracting blocks from said residue, injecting said blocks into said structure, wherein the injection makes use of window-weighted blocks in an overlap-add approach, said injected blocks at least partially overlapping in time, wherein said blocks are injected with a parameter that is variable between at least two injected blocks, the variable parameter being one of:

a write start time of the injected block, and an overlap rate between two successive injected blocks, wherein the variable parameter varies pseudo-randomly for at least one injected block.

* * * * *